(12) United States Patent
Clemens et al.

(10) Patent No.: US 7,709,865 B2
(45) Date of Patent: May 4, 2010

(54) SUBSTRATE FOR AN ORGANIC FIELD EFFECT TRANSISTOR, USE OF SAID SUBSTRATE, METHOD OF INCREASING THE CHARGE CARRIER MOBILITY, AND ORGANIC FIELD EFFECT TRANSISTOR (OFET)

(75) Inventors: Wolfgang Clemens, Puschendorf (DE); Henning Rost, Erlangen (DE)

(73) Assignee: PolyIC GmbH & Co. KG, Furth (DE)

( * ) Notice: Subject to any disclaimer, the term of this patent is extended or adjusted under 35 U.S.C. 154(b) by 332 days.

(21) Appl. No.: 10/517,750

(22) PCT Filed: Jun. 6, 2003

(86) PCT No.: PCT/DE03/01899

§ 371 (c)(1),
(2), (4) Date: Jun. 10, 2005

(87) PCT Pub. No.: WO03/107450

PCT Pub. Date: Dec. 24, 2003

(65) Prior Publication Data

US 2005/0224787 A1    Oct. 13, 2005

(30) Foreign Application Priority Data

Jun. 13, 2002    (DE) ................. 102 26 370

(51) Int. Cl.
| | |
|---|---|
| H01L 35/24 | (2006.01) |
| H01L 51/00 | (2006.01) |
| H01L 23/58 | (2006.01) |
| H01L 51/30 | (2006.01) |
| H01L 29/04 | (2006.01) |
| H01L 29/43 | (2006.01) |

(52) U.S. Cl. .............. 257/288; 257/40; 257/632; 257/E51.006; 257/E51.025; 257/E29.003; 257/E29.139; 438/479

(58) Field of Classification Search ............... None
See application file for complete search history.

(56) References Cited

U.S. PATENT DOCUMENTS 3,512,052 A    12/1970    MacIver et al.

(Continued)

FOREIGN PATENT DOCUMENTS

DE    33 38 597    5/1985

(Continued)

OTHER PUBLICATIONS

D.D.C. Bradley, J. Phys. D: Appl. Phys., vol. 20, 1987, pp. 1389-1410.*

(Continued)

*Primary Examiner*—Andy Huynh
*Assistant Examiner*—Hoang-Quan T Ho
(74) *Attorney, Agent, or Firm*—Carella, Byrne, et al.; Elliot M. Olstein; William Squire

(57) ABSTRACT

An organic field effect transistor includes a well-ordered substrate layer on which organic functional material is deposited. A method of increasing the charge carrier mobility of the organic field effect transistor substrate layer is achieved by depositing onto the substrate an organic functional material, the substrate being in the form of a well-ordered layer. The method and transistor include using a well-ordered plastics film as the substrate layer.

11 Claims, 1 Drawing Sheet

U.S. PATENT DOCUMENTS

| | | | |
|---|---|---|---|
| 3,769,096 A | 10/1973 | Ashkin | |
| 3,955,098 A | 5/1976 | Kawamoto | |
| 4,059,667 A * | 11/1977 | Pangonis | 264/216 |
| 4,302,648 A | 11/1981 | Sado et al. | |
| 4,340,657 A | 7/1982 | Rowe | |
| 4,442,019 A | 4/1984 | Marks | |
| 4,865,197 A | 9/1989 | Craig | |
| 4,926,052 A | 5/1990 | Hatayama | |
| 4,937,119 A | 6/1990 | Nickles et al. | |
| 5,173,835 A | 12/1992 | Cornett et al. | |
| 5,206,525 A | 4/1993 | Yamamoto et al. | |
| 5,259,926 A | 11/1993 | Kuwabara et al. | |
| 5,321,240 A | 6/1994 | Takahira | |
| 5,347,144 A | 9/1994 | Garnier et al. | |
| 5,364,735 A | 11/1994 | Akamatsu et al. | |
| 5,395,504 A | 3/1995 | Saurer et al. | |
| 5,480,839 A | 1/1996 | Ezawa et al. | |
| 5,486,851 A | 1/1996 | Gehner et al. | |
| 5,502,396 A | 3/1996 | Desarzens | |
| 5,546,889 A * | 8/1996 | Wakita et al. | 117/84 |
| 5,569,879 A | 10/1996 | Gloton et al. | |
| 5,574,291 A | 11/1996 | Dodabalapur et al. | |
| 5,578,513 A | 11/1996 | Maegawa | |
| 5,580,794 A | 12/1996 | Allen | |
| 5,625,199 A | 4/1997 | Baumbach et al. | |
| 5,629,530 A | 5/1997 | Brown et al. | |
| 5,630,986 A | 5/1997 | Miller et al. | |
| 5,652,645 A | 7/1997 | Jain | |
| 5,691,089 A | 11/1997 | Smayling | |
| 5,705,826 A | 1/1998 | Aratani et al. | |
| 5,729,428 A | 3/1998 | Sakata et al. | |
| 5,817,550 A * | 10/1998 | Carey et al. | 438/166 |
| 5,854,139 A | 12/1998 | Kondo et al. | |
| 5,856,013 A * | 1/1999 | Abkowitz et al. | 428/412 |
| 5,869,972 A | 2/1999 | Birch et al. | |
| 5,883,397 A | 3/1999 | Isoda et al. | |
| 5,892,244 A | 4/1999 | Tanaka et al. | |
| 5,946,551 A | 8/1999 | Dimitrakopoulos | |
| 5,967,048 A | 10/1999 | Fromson et al. | |
| 5,970,318 A | 10/1999 | Choi et al. | |
| 5,973,598 A | 10/1999 | Beigel | |
| 5,994,174 A * | 11/1999 | Carey et al. | 438/166 |
| 5,994,773 A | 11/1999 | Hirakawa | |
| 5,997,817 A | 12/1999 | Crismore et al. | |
| 5,998,805 A | 12/1999 | Shi et al. | |
| 6,036,919 A | 3/2000 | Thym et al. | |
| 6,045,977 A | 4/2000 | Chandross et al. | |
| 6,060,338 A | 5/2000 | Tanaka et al. | |
| 6,072,716 A | 6/2000 | Jacobsen et al. | |
| 6,083,104 A | 7/2000 | Choi | |
| 6,087,196 A | 7/2000 | Sturm et al. | |
| 6,133,835 A | 10/2000 | De Leeuw et al. | |
| 6,150,668 A | 11/2000 | Bao et al. | |
| 6,197,663 B1 | 3/2001 | Chandross et al. | |
| 6,207,472 B1 | 3/2001 | Calligari et al. | |
| 6,215,130 B1 | 4/2001 | Dodabalapur | |
| 6,221,553 B1 | 4/2001 | Wolk et al. | |
| 6,251,513 B1 | 6/2001 | Hyatt et al. | |
| 6,284,562 B1 | 9/2001 | Batlogg et al. | |
| 6,300,141 B1 | 10/2001 | Segal et al. | |
| 6,321,571 B1 | 11/2001 | Themont et al. | |
| 6,322,736 B1 | 11/2001 | Bao et al. | |
| 6,326,640 B1 * | 12/2001 | Shi et al. | 257/40 |
| 6,329,226 B1 | 12/2001 | Jones et al. | |
| 6,330,464 B1 | 12/2001 | Colvin et al. | |
| 6,335,539 B1 | 1/2002 | Dimitrakopoulos et al. | |
| 6,340,822 B1 | 1/2002 | Brown et al. | |
| 6,344,662 B1 | 2/2002 | Dimitrakopoulos et al. | |
| 6,362,509 B1 | 3/2002 | Hart | |
| 6,384,804 B1 | 5/2002 | Dodabalapur et al. | |
| 6,403,396 B1 | 6/2002 | Gudesen et al. | |
| 6,429,450 B1 | 8/2002 | Mutsaers et al. | |
| 6,433,359 B1 * | 8/2002 | Kelley et al. | 257/40 |
| 6,498,114 B1 | 12/2002 | Amundson et al. | |
| 6,517,955 B1 | 2/2003 | Takada et al. | |
| 6,555,840 B1 | 4/2003 | Hudson et al. | |
| 6,593,690 B1 | 7/2003 | McCormick et al. | |
| 6,603,139 B1 | 8/2003 | Tessler et al. | |
| 6,621,098 B1 | 9/2003 | Jackson et al. | |
| 6,852,583 B2 | 2/2005 | Bernds et al. | |
| 6,903,958 B2 | 6/2005 | Bernds et al. | |
| 2001/0046081 A1 * | 11/2001 | Hayashi et al. | 359/296 |
| 2002/0018911 A1 | 2/2002 | Bernius et al. | |
| 2002/0022284 A1 * | 2/2002 | Heeger et al. | 438/22 |
| 2002/0025391 A1 | 2/2002 | Angelopoulos | |
| 2002/0053320 A1 | 5/2002 | Duthaler | |
| 2002/0056839 A1 | 5/2002 | Joo et al. | |
| 2002/0068392 A1 | 6/2002 | Lee et al. | |
| 2002/0130042 A1 | 9/2002 | Stiene et al. | |
| 2002/0170897 A1 | 11/2002 | Hall | |
| 2002/0195644 A1 | 12/2002 | Dodabalapur et al. | |
| 2003/0059987 A1 | 3/2003 | Sirringhaus et al. | |
| 2003/0112576 A1 | 6/2003 | Brewer et al. | |
| 2003/0175427 A1 | 9/2003 | Loo et al. | |
| 2004/0002176 A1 | 1/2004 | Xu | |
| 2004/0013982 A1 | 1/2004 | Jacobson et al. | |
| 2004/0026689 A1 | 2/2004 | Bernds et al. | |
| 2004/0084670 A1 | 5/2004 | Tripsas et al. | |
| 2004/0211329 A1 | 10/2004 | Funahata et al. | |

FOREIGN PATENT DOCUMENTS

| | | |
|---|---|---|
| DE | 4243832 | 6/1994 |
| DE | 198 52 312 | 5/1999 |
| DE | 198 16 860 | 11/1999 |
| DE | 199 18 193 | 11/1999 |
| DE | 198 51703 | 5/2000 |
| DE | 199 21 024 | 11/2000 |
| DE | 19933757 | 1/2001 |
| DE | 69519872 | 1/2001 |
| DE | 199 35 527 | 2/2001 |
| DE | 199 37 262 | 3/2001 |
| DE | 100 12204 | 9/2001 |
| DE | 100 33112 | 1/2002 |
| DE | 100 45 192 | 4/2002 |
| DE | 100 47 171 | 4/2002 |
| DE | 100 43204 | 4/2002 |
| DE | 100 58 559 | 5/2002 |
| DE | 100 61297 | 6/2002 |
| DE | 10006257 | 6/2002 |
| DE | 101 17 663 A1 | 10/2002 |
| DE | 101 20 687 | 10/2002 |
| DE | 102 19 905 | 12/2003 |
| EP | 0 108650 | 5/1984 |
| EP | 0 128 529 | 12/1984 |
| EP | 0 268 370 A2 | 5/1988 |
| EP | 0 268 370 A3 | 5/1988 |
| EP | 0 350 179 | 1/1990 |
| EP | 0 418504 | 3/1991 |
| EP | 0 442123 | 8/1991 |
| EP | 0 460 242 | 12/1991 |
| EP | 0460242 | 12/1991 |
| EP | 0501456 A2 | 9/1992 |
| EP | 0501456 A3 | 9/1992 |
| EP | 0 511807 | 11/1992 |
| EP | 0 528662 | 2/1993 |
| EP | 0685985 | 12/1995 |
| EP | 0716458 | 6/1996 |
| EP | 0 785 578 A2 | 7/1997 |
| EP | 0 785 578 A3 | 7/1997 |
| EP | 0 786820 | 7/1997 |
| EP | 0 615 258 B1 | 9/1998 |
| EP | 0962984 | 12/1999 |
| EP | 0968182 | 12/1999 |

| | | |
|---|---|---|
| EP | 0 981 165 | 2/2000 |
| EP | 0 979715 | 2/2000 |
| EP | 0981165 | 2/2000 |
| EP | 0989614 A2 | 3/2000 |
| EP | 1 048 912 | 11/2000 |
| EP | 1 052 594 | 11/2000 |
| EP | 1065725 A2 | 1/2001 |
| EP | 1065725 A3 | 1/2001 |
| EP | 1 083 775 A1 | 3/2001 |
| EP | 1 102 335 A2 | 5/2001 |
| EP | 1 104 035 A2 | 5/2001 |
| EP | 1 103916 | 5/2001 |
| EP | 1 134 694 | 9/2001 |
| EP | 1224999 | 7/2002 |
| EP | 1237207 | 9/2002 |
| EP | 1 318 084 | 6/2003 |
| FR | 2793089 | 11/2000 |
| GB | 723598 | 2/1955 |
| GB | 2 058 462 | 4/1981 |
| GR | 2001P20024 | 8/2000 |
| GR | 2001P03239 | 1/2001 |
| JP | 54069392 | 6/1979 |
| JP | 60117769 | 6/1985 |
| JP | 61001060 | 1/1986 |
| JP | 61167854 | 7/1986 |
| JP | 362065477 A | 3/1987 |
| JP | 01169942 | 7/1989 |
| JP | 04-199638 A * | 6/1992 |
| JP | 05152560 | 6/1993 |
| JP | 05259434 | 10/1993 |
| JP | 05347422 | 12/1993 |
| JP | 08197788 | 8/1995 |
| JP | 09083040 | 3/1997 |
| JP | 09320760 | 12/1997 |
| JP | 10026934 | 1/1998 |
| JP | 2969184 B | 11/1999 |
| JP | 2001085272 | 3/2001 |
| WO | WO 93/01641 | 8/1993 |
| WO | WO 93 16491 | 8/1993 |
| WO | WO 94/17556 | 8/1994 |
| WO | WO 95/06240 | 3/1995 |
| WO | WO95/31831 * | 11/1995 |
| WO | WO 9531831 | 11/1995 |
| WO | WO 96 02924 | 2/1996 |
| WO | WO 96/19792 | 8/1996 |
| WO | WO 97/12349 | 4/1997 |
| WO | WO 97/18944 | 5/1997 |
| WO | WO 98/18156 | 4/1998 |
| WO | WO 98 18186 | 4/1998 |
| WO | WO 98/40930 | 9/1998 |
| WO | WO 99/07189 | 2/1999 |
| WO | WO 99 10929 | 3/1999 |
| WO | WO 99/10929 | 3/1999 |
| WO | WO 99 10939 | 3/1999 |
| WO | WO 99 21233 | 4/1999 |
| WO | WO 99 30432 | 6/1999 |
| WO | WO 99 39373 | 8/1999 |
| WO | WO 99 40631 | 8/1999 |
| WO | WO 99/40631 | 8/1999 |
| WO | WO 99/53371 | 10/1999 |
| WO | WO 99/54936 | 10/1999 |
| WO | WO 99 54936 | 10/1999 |
| WO | WO 99/66540 | 12/1999 |
| WO | WO 00/33063 | 6/2000 |
| WO | WO 00/36666 | 6/2000 |
| WO | WO 01/03126 | 1/2001 |
| WO | WO 01/06442 | 1/2001 |
| WO | WO 0108241 | 2/2001 |
| WO | WO 01 15233 | 3/2001 |
| WO | WO 01/17029 | 3/2001 |
| WO | WO 01/17041 | 3/2001 |
| WO | WO 0117041 | 3/2001 |
| WO | WO 01/27998 | 4/2001 |
| WO | WO 01/46987 | 6/2001 |
| WO | WO 01/47044 A2 | 6/2001 |
| WO | WO 01/47044 A3 | 6/2001 |
| WO | WO 01 47045 | 6/2001 |
| WO | WO 0147044 A2 | 6/2001 |
| WO | WO 0147044 A3 | 6/2001 |
| WO | WO 01/73109 A2 | 10/2001 |
| WO | WO 01/73109 A3 | 10/2001 |
| WO | WO 02/05360 | 1/2002 |
| WO | WO 0205361 | 1/2002 |
| WO | WO 02/15264 | 2/2002 |
| WO | WO 02 19443 | 3/2002 |
| WO | WO0219443 | 3/2002 |
| WO | WO 02/29912 | 4/2002 |
| WO | WO 02/43071 | 5/2002 |
| WO | WO 02/47183 | 6/2002 |
| WO | WO0247183 | 6/2002 |
| WO | WO 02/065557 | 8/2002 |
| WO | WO 02/071139 | 9/2002 |
| WO | WO 02/071505 | 9/2002 |
| WO | WO 02/076924 | 10/2002 |
| WO | WO 02/091495 | 11/2002 |
| WO | WO 02095805 A2 | 11/2002 |
| WO | WO 02095805 A3 | 11/2002 |
| WO | WO 02/099907 | 12/2002 |
| WO | WO 02/099908 | 12/2002 |
| WO | WO 03/046922 | 6/2003 |
| WO | WO 03/067680 | 8/2003 |
| WO | WO 03/069552 | 8/2003 |
| WO | WO 03/081671 | 10/2003 |
| WO | WO 03/095175 | 11/2003 |
| WO | WO 2004/032257 | 4/2004 |
| WO | WO 2004/042837 | 5/2004 |
| WO | WO 2004042837 | 5/2004 |
| WO | WO 2004/007194 A2 | 6/2004 |
| WO | WO 2004/007194 A3 | 6/2004 |
| WO | WO 2004/047144 A3 | 6/2004 |
| WO | WO 2004/083859 | 9/2004 |
| WO | WO 00 79617 | 12/2004 |

OTHER PUBLICATIONS

T.W. Hagler et al., Phys. Rev. B, vol. 44, No. 16, Oct. 15, 1991, pp. 8652-8666.*
Bao et al. High-Performance Plastic Transistors Fabricated by Printing Techniques. 1997. American Chemical Society. Chem. Mater., vol. 9, No. 6. pp. 1299-1301.*
Manuelli et al. Applicability of coating techniques for the production of organic field effect transistors. Aug. 7, 2002. IEEE Polytronic 2002 Conference. pp. 201-204.*
Cole et al. A new approach to the characterization of molecular orientation in uniaxially and biaxially oriented samples of poly(ethylene terephthalate). 1999. Polymer 40. pp. 3505-3513.*
Bao et al. Soluble and processable regioregular poly(3-hexylthiophene) for thin film field-effect transistor applications with high mobility. Dec. 23, 1996. Appl. Phys. Lett., vol. 69, No. 26. pp. 4108-4110.*
Dai, L. et al., "Conjugation of Polydienes by Oxidants Other Than Iodine", Elsevier Science S.A., Synthetic Metals 86 (1997) 1893-1894.
Kawase, T. et al., "Inkjet Printed Via-Hole Interconnections and Resistors for All-Polymer Transistor Circuits", Advanced Materials 2001, 13, No. 21, Nov. 2, 2001, pp. 1601-1605.
Qiao, X. et al., "The FeCl3-doped poly3-alkithiophenes) in solid state", Elsevier Science, Synthetic Metals 122 (2001) pp. 449-454.
U.S. Appl. No. 10/533,756, Wolfgang Clemens et al.
U.S. Appl. No. 10/535,448, Wolfgang Clemens et al.
U.S. Appl. No. 10/535,448, W. Clemens et al.
U.S. Appl. No. 10/535,449, Walter Fix et al.
U.S. Appl. No. 10/344,926, Feb. 12, 2004, Adolf Bernds et al.
U.S. Appl. No. 10/541,815, Axel Gerlt et al.
U.S. Appl. No. 10/541,956, Wolfgang Clemens et al.
U.S. Appl. No. 10/541,957, Walter Fix et al.

U.S. Appl. No. 10/543,561, Wolfgang Clemens et al.
U.S. Appl. No. 10/542,678, Adolf Bernds et al.
U.S. Appl. No. 10/542,679, Adolf Bernds et al.
Brabec, C.J. et al, "Photoinduced FT-IR spectroscopy and CW-photocurrent measurements of conjugated polymers and fullerenes blended into a conventional polymer matrix", Solar Energy Materials and Solar Cells, 2000 Elsevier Science V.V., pp. 19-33.
Brabec, C.J. et al., "Photovoltaic properties of a conjugated polymer/ methanofullerene composites embedded in a polystyrene matrix", Journal of Applied Physics, vol. 85, No. 9, 1999, pp. 6866-6872.
Gosain, D.P., "Excimer laser crystallized poly-Si TFTs on plastic substrates", Second International Symposium on Laser Precision Microfabrication, May 16-18, 2001, Singapore, vol. 4426, pp. 394-400.
Harsanyi G. et al., "Polytronics for biogtronics: unique possibilities of polymers in biosensors and BioMEMS", IEEE Polytronic 2002 Conference, Jun. 23, 2002, pp. 211-215.
Koezuka, H. et al., "Macromolecular Electronic Device", Mol. Cryst. Liq. Cryst. 1994, vol. 2555, pp. 221-230.
Lu, Wen et al., "Use of Ionic Liquids for π-Conjugated Polymer Electrochemical Devices", Science, vol. 297, 2002, pp. 983-987.
Shaheen, S.E., et al., "Low band-gap polymeric photovoltaic devices", Synthetic Metals, vol. 121, 2001, pp. 1583-1584.
Takashima, W. et al., Electroplasticity Memory Devices Using Conducting Polymers and Solid Polymer Electrolytes, Polymer International, Melbourne, 1992, pp. 249-253.
Velu, G. et al. "Low Driving Voltages and Memory Effect in Organic Thin-Film Transistors With a Ferroelectric Gate Insulator", Applied Physics Letters, American Institute of Physics, New York, vol. I79, No. 5, 2001, pp. 659-661.
Wang, Hsing et al., "Conducting Polymer Blends: Polythiophene and Polypyrrole Blends with Polystyrene and Poly(bisphenol A carbonate)", Macromolecules, 1990, vol. 23, pp. 1053-1059.
Wang, Yading et al., "Electrically Conductive Semiinterpenetrating Polymer Networks of Poly(3-octylthiophene)", Macromolecules 1992, vol. 25, pp. 3284-3290.
U.S. Appl. No. 10/344,951, Adolf Bemds et al.
U.S. Appl. No. 10/362,932, filed Oct. 2, 2003, Adolf Bemds et al.
U.S. Appl. No. 10/380,113, filed Sep. 25, 2003, Adolf Bemds et al.
U.S. Appl. No. 10/380,206, Adolf Bemds et al.
U.S. Appl. No. 10/381,032, Adolf Bemds et al.
U.S. Appl. No. 10/433,959, Adolf Bemds.
U.S. Appl. No. 10/433,961, Wolfgang Clemens et al.
U.S. Appl. No. 10/451,108, Mark Giles et al.
U.S. Appl. No. 10/467,636, Adolf Bemds et al.
U.S. Appl. No. 10/473,050, Adolf Bemds et al.
U.S. Appl. No. 10/479,234, filed Dec. 30, 2004, Adolf Bemds et al.
U.S. Appl. No. 10/479,238, Adolf Bemds et al.
U.S. Appl. No. 10/492,922, Erwann Buillet et al.
U.S. Appl. No. 10/492,923, filed Dec. 23, 2004, Wolfgang Clemens et al.
U.S. Appl. No. 10/498,610, Walter Fix et al.
U.S. Appl. No. 10/508,640, Walter Fix et al.
U.S. Appl. No. 10/508,737, Adolf Bemds et al.
U.S. Appl. No. 10/517,750, Wolfgang Clemens et al.
U.S. Appl. No. 10/523,216, Adolf Bemds et al.
U.S. Appl. No. 10/523,487, Wolfgang Clemens et al.
U.S. Appl. No. 10/524,646, Walter Fix et al.
Fraunhofer Magazin, 'Polytronic: Chips voon der Rolle, Nr. 4, 2001, pp. 8-13.
deLeeuw, D.M. et al., "Polymeric Integrated Circuits and Light-Emitting Diodes", IEEE 1997, pp. 331-337.
Schrodner, S. et al., "Plastic Electronics Based on Semiconducting Polymers", Session 4: Polymer Electronic Devices II, pp. 91-94.
Lowe, J. et al., "Poly(3(2-acetoxyethyl)thiophene): A model polymer for acid-catalyzed lithography", Elsevier Science S.A., 1997, Synthetic Metals 85 pp. 1427-1430.
Oelkrug, D. et al., "Electronic spectra of self-organized oligothiophene films with 'standing' and 'lying' molecular units", Elsevier Science S.A., 1998, Thin Solid Films 284-270.
Sandberg, H. et al, "Ultra-thin Organic Films for Field Effect Transistors", SPIE vol. 4466, 2001, pp. 35-43.
Chen, X.L. et al., "Morphological and Transistor Studies of Organic Molecular Semiconductors with Anisotropic Electrical Characteristics", American Chemical Society, 2001, Chem. Mater. 2001, 13, 1341-1348.
Garnier F et al:, "Vertical Devices Architecture by Molding of Organic-Based Thin Film Transistor", Applied Physics Letters, American Institute of Physics. XP000784120, issn: 0003-6951 abbildung 2.
Collet J. et al:, 'Low Voltage, 30 NM Channel Length, Organic Transistors With a Self-Assembled Monolayer as Gate Insulating Films:, Applied Physics Letters, American Institute of Physics. New York, US, Bd 76, Nr. 14, Apr. 3, 2000, Seiten 1941-1943, XP000950589, ISSN:0003-6951, das ganze Dokument.
Hwang J D et al:, "A Vertical Submicron Slc thin film transistor", Solid State Electronics, Elsevier Science Publishers, Barking, GB, Bd. 38, NR. 2, Feb. 1, 1995, Seiten 275-278, XP004014040, ISSN:0038-1101, Abbildung 2.
Rogers J A et al:, "Low-Voltage 0.1 Mum Organic Transistors and Complementary Inverter Circuits Fabricated with a Low-Cost Form of Near-Field Photolithography", Applied Physics Letters, American Institute of Physics. New York, US, Bd. 75, Nr. 7, Aug. 16, 1999, Seiten 1010-1012, XP000934355, ISSN: 003-6951, das ganze Dokument.
"Short-Channel Field-Effect Transistor", IBM Technical Disclosure Bulletin, IBM Corp., New York, US, Bd. 32, Nr. 3A, Aug. 1, 1989, Seiten 77-78, XP000049357, ISSN:0018-8689, das ganze Dokument.
Redecker, M. et al., "Mobility enhancement through homogeneous nematic alignment of a liquid-crystalline polyfluorene", 1999 American Institute of Physics, Applied Physics Letters, vol. 74, No. 10, pp. 1400-1402.
Rogers, J. A. et al:, "Printing Process Suitable for Reel-to-Reel Production of High-Performance Organic Transistors and Circuits", Advanced Materials, VCH, Verlagsgesellschaft, Weinheim, DE, Bd. 11, Nr. 9, Jul. 5, 1999, Seiten 741-745, P000851834, ISSN: 0935-9848, das ganze Dokument.
Miyamoto, Shoichi et al:, °Effect of LDD Structure and Channel Poly-Si Thinning on a Gate-All-Around TFT (GAT) for SRAM's, IEEE Transactions on Electron Devices, vol. 46, No. 8, Aug. 1999.
Kumar, Anish et al:, "Kink-Free Polycrystalline Silicon Double-Gate Elevated-Channel Thin-Film Transistors", IEEE Transactions on Electron Devices, vol. 45, No. 12, Dec. 1998.
Chen, Shiao-Shien et al:, "Deep Submicrometer Double-Gate Fully-Depleted SOI PMOS Devices: A Concise Short-Channel Effect Threshold Voltage Model Using a Quasi-2D Approach", IEEE Transaction on Electron Devices, vol. 43, No. 9, Sep. 1998.
Zangara L: "Metall Statt Halbleiter, Programmierung Von Embedded ROMS Ueber Die Metallisierungen", Elektronik, Franzls Verlag GMBH, Munchen, DE, Bd. 47, Nr. 16, Aug. 4, 1998, Seiten 52-55, XP000847917, ISSN: 0013-5658, Seite 52, rechtes Plate, Zeile 7-Seite 53, linke Spalte, Zeile 14; Abbildungen 1, 2.
Hergel, H. J.: "Pld-Programmiertechnologien", Elektronik, Franzis Verlag GMBH. Munchen, DE, Bd 41, Nr. 5, Mar. 3, 1992, Seiten 44-46, XP000293121, ISSN: 0013-5658, Abbildungen 1-3.
Forrest et al.: "The Dawn of Organic Electronics", IEEE Spectrum, Aug. 2000, Seiten 29-34, XP002189000, IEEE Inc., New York, US ISSN:0018-9235, Seite 33, rechte Spalte, Zelle 58-Seite 34, linke Spalte, Zeile 24; Abbildung 5.
Patent Abstracts of Japan, vol. 009, No. 274 (E-354), Oct. 31, 1985 & JP 60 117769 A (Fujitsu KK), Jun. 25, 1985 Zusammenfassung.
Zie Voor Titel Boek, de 2e Pagina, XP-002189001, p. 196-228.
Drury et al., "Low-Cost All-Polymer Integrated Circuits", American Institute of Physics, Applied Physics Letters, 1998, vol. 73, No. 1, pp. 108-110, Jul. 6, 1998.
Kuhlmann et al., "Terabytes in Plastikfolie", Organische Massenspeicher vor der Serienproduktion.
Garnier, F. et al, "All-Polymer Field-Effect Transistor Realized by Printing Techniques", Science, American Association for the Advancement of Science, US, vol. 265, Sep. 16, 1994, pp. 1684-1686.
Assadi A, et al:, Field-Effect Mobility of Poly (3-Hexylthiophene) Dept. of Physics and Measurement Technology, Received Mar. 3, 1988; accepted for Publication May 17, 1988.

Bao, Z. et al., "High-Performance Plastic Transistors Fabricatecd by Printing Techniques", Chem. Mater vol. 9, No. 6, 1997, pp. 1299-1301.

Hebner, T.R. et al., Ink-jet printing of doped polymers for organic light emitting devices:, American Institute of Physics, Applied Physics Letters, vol. 72, No. 5, Feb. 2, 1998, pp. 519-521.

Angelopoulos M et al, "In-Situ Radiation Induced Doping", Mol. Cryst. Liq. Cryst. 1990, vol. 189, pp. 221-225.

Dai, L. et al, Photochemical Generation of Conducting Pattersn in Polybutadiene Films:, Macromolecules, vol. 29, No. 1, 1996, pp. 282-287, XP 001042019, the whole document.

Roman et al., Polymer Diodes With High Rectification:, Applied Physics Letters, vol. 75, No. 21, Nov. 22, 1999.

Patent Abstracts of Japan, vol. 010, No. 137, May 21, 1986 (JP 361001060A).

Schoebel, "Frequency Conversion with Organic-On-Inorganic Heterostructured Diodes", Extended Abstracts of the International Conference on Solid State Devices and Materials, Sep. 1, 1997.

Braun D., et al, "Visible light emission from semiconducting polymer diodes", American Institute of Physics, Applied Physics Letters 58, May 6, 1991, pp. 1982-1984.

Yu, G. et al., "Dual-function semiconducting polymer devices: Light-emitting and photodetecting diodes", American Institute of Physics, Applied Physics Letter 64, Mar. 21, 1994, pp. 1540-1542.

Lucent Technologies, "Innovation marks significant milestone in the development of electronic paper", Cambridge, MA and Murray Hill, NJ, Nov. 20, 2000. XP-002209726.

Garnier et al., "Conjugated Polymers and Oligomers as Active Material for Electronic Devices", Synthetic Metals, vol. 28, 1989.

Gelinck, G.H. et al., "High-Performance All-Polymer Integrated Circuits", Applied Physics Letters, v. 77, 2000, pp. 1487-1489.

Zheng, Xiang-Yang et al., "Electrochemical Patterning of the Surface of Insulators with Electrically Conductive Polymers", J. Electrochem. Soc., v. 142, 1995, pp. L226-L227.

Lidzey, D. G. et al., "Photoprocessed and Micropatterned Conjugated Polymer LEDs", Synthetic Metals, V. 82, 1996, pp. 141-148.

Kobel W. et al., "Generation of Micropatterns in Poly (3-Methyl-Thiophene) Films Using Microlithography: A First Step in the Design of an All-Organic Thin-Film Transistor" Synthetic Metals, V. 22, 1988, pp. 265-271.

Rost, Henning et al., "All-Polymer Organic Field Effect Transistors", Proc. Mat. Week, CD, 2001, pp. 1-6.

Manuelli, Alessandro et al., "Applicability of Coating Techniques for the Production of Organic Field Effect Transistors", IEEE Polytronic 2002 Conference, 2002, pp. 201-204.

Ullman, A. et al., "High Performance Organic Field-Effect Transistors and Integrated Inverters", Mat. Res. Soc. Symp. Proc., v. 665, 2001, pp. 265-270.

Fix, W. et al., "Fast Polymer Integrated Circuits Based on a Polyfluorene Derivative", ESSDERC 2002, 2002, pp. 527-529.

Knobloch, A. et al., "Printed Polymer Transistors", Proc. Polytronic, v. 84, 2001, pp. 84-89.

Ficker, J. et al., "Dynamic and Lifetime Measurements of Polymer OFETS and Integrated Plastic Circuits," Proc. of SPIE, v. 466, 2001, pp. 95-102.

Clemens, W. et al., "Vom Organischen Transistor Zum Plastik-Chip," Physik Journal, V. 2, 2003, pp. 31-36.

Crone, B. et al, "Large-scale complementary Integrated circuits based on Organic transistors", Nature, vol. 403, Feb. 3, 2000, pp. 521.

Fix, W., et al., "Fast polymer integrated circuits", American Institute of Physics, Applied Physics Letters, vol. 81, No. 89, Aug. 2002, pp. 1735-1737.

Dodabalapur, A. et al., Organic smart pixels, American Institute of Physics, Applied Physics Letters, vol. 73, No. 2, Jul. 13, 1998, pp. 142-144.

Halls, J.J. M., et al., "Efficient photodiodes from interpenetrating polymer networks", Nature, vol. 376, Aug. 10, 1995, pp. 498-500.

Brown, A.R. et al., "Field-effect transistors made from solution-processed organic semiconductors", Elsevier Science, S.A., Synthetic Metals 88 (1997) pp. 37-55.

Brown, A.R., "Logic Gates Made from Polymer Transistors and Their Use in Ring Oscillators", Science, vol. 270, Nov. 10, 1995, pp. 972-974.

Klauk, H. et al., "Pentacene Thin Film Transistors and Inverter Circuits", 1997 International Exectron Devices Meeting Technical Digest, pp. 539-542, Dec. 1997.

Klauk, H. et al., "Fast Organic Thin Film Transistor Circuits", IEEE Electron Device Letters, vol. 20, No. 6, pp. 289-291.

Bao, Z. et al., "Organic and Polymeric Materials for the Fabrications of Thin Film Field-Effect Transistors", paper presented at the meeting of American Chemical Society, Division of Polymer Chemistry, XX, XX, Bd. 39, Nr. 1, Mar. 29, 1998, P001032497, ISSN: 0032-3934 das ganze Dokument.

Patent Abstracts of Japan, vol. 013, No. 444 (E-828), Oct. 5, 1989 & JP 01 169942 A (Hitachi Ltd), Jul. 5, 1989.

U.S. Appl. No. 10/562,989, Jun. 29, 2006, Jurgen Ficker et al.

U.S. Appl. No. 10/562,869, Oct. 5, 2006, Walter Fix et al.

U.S. Appl. No. 10/569,763, Walter Fix et al.

U.S. Appl. No. 10/568,730, Feb. 8, 2007, Wolfgang Clemens et al.

U.S. Appl. No. 10/569,233, Jan. 25, 2007, Adolf Bernds et al.

U.S. Appl. No. 10/570,571, Jan. 11, 2017, Wolfgang Clemens et al.

U.S. Appl. No. 10/585,775, Walter Fix.

U.S. Appl. No. 11/574,139, Jurgen Ficker.

* cited by examiner

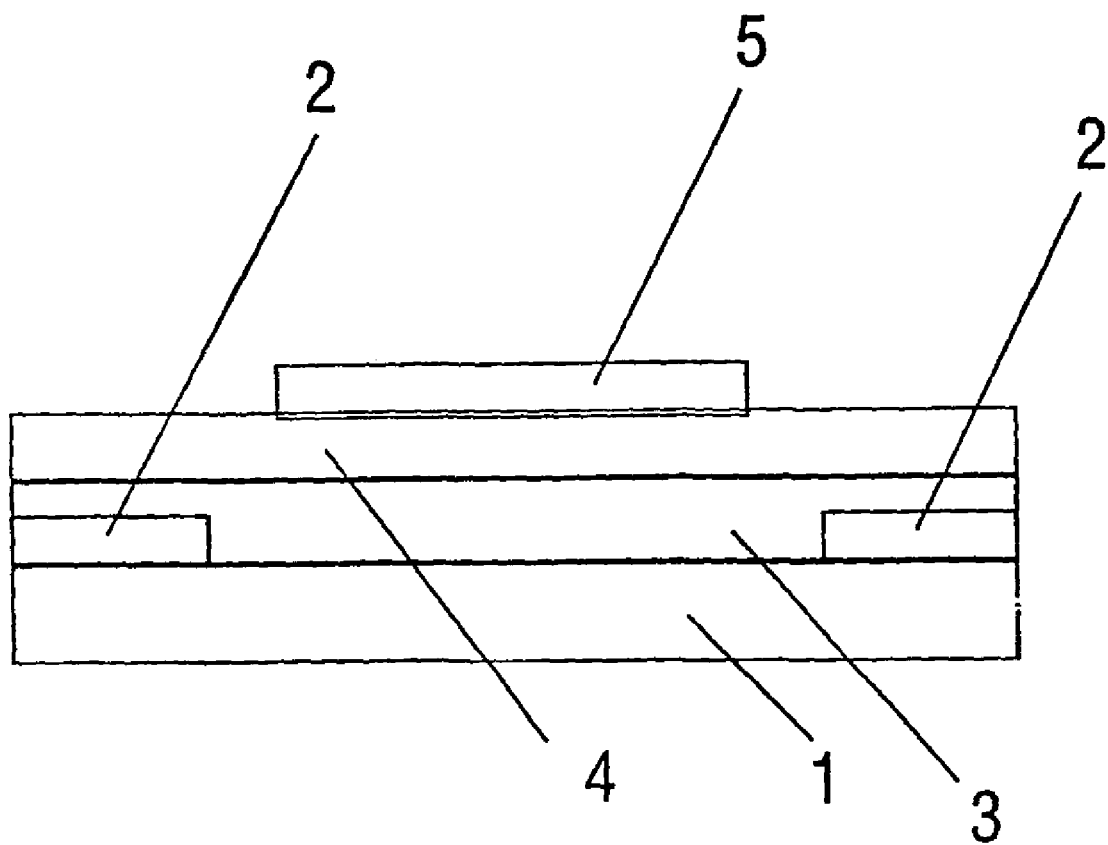

SUBSTRATE FOR AN ORGANIC FIELD EFFECT TRANSISTOR, USE OF SAID SUBSTRATE, METHOD OF INCREASING THE CHARGE CARRIER MOBILITY, AND ORGANIC FIELD EFFECT TRANSISTOR (OFET)

The invention relates to a substrate for an organic field effect transistor, to the use of said substrate, to a method of increasing the charge carrier mobility and to an organic field effect transistor onto which an organic functional material can be deposited in the form of a well-ordered layer.

When fabricating electric circuits based on organic materials, as in the case of organic diodes, condensers and, in particular, organic field effect transistors (OFETs) for example, thin layers of an organic functional material are applied to suitable substrates of silicon, glass or plastics material by various methods, such as spin-coating, knife coating, spraying, plotting, printing, vapor deposition, sputtering, etc. In order to obtain favorable material characteristics conducive to good electrical performance, i.e., characteristics such as high electrical conductivity or a high charge carrier mobility, it is advantageous to produce a certain degree of molecular orderliness in the organic functional material.

In the literature there are described simple substrates of silicon [Z. Bao et at, Appl. Phys. Lett. 69 (26) (1996) 4108]; polycarbonate [O. H. Gelinck et at, Appl. Phys. Lett. 77 (10) (2000) 1487] or polyimide [C. J. Drury et at, Appl. Phys. Lett. 73 (1) (1998) 108], and, in addition, mechanically pretreated, ie brushed polyimide substrates, which facilitate a well-25 ordered deposition of conjugated polymers as semiconductors and thus lead to higher field effects in OFETs compared with unprocessed polyimide [H. Sirringhaus et at, Science 290 (2000) 2123]. Mechanical pretreatment is cost-intensive, ie it involves an additional processing step and can cause damage to the surface of the substrate.

U.S. 2002041427 discloses a process for the production of a crystalline, nonlinear optical (NLO) film, in which the well-ordered application of the NLO film is facilitated by means of an intermediate layer (alignment layer) applied just for this purpose.

Except for these attempts to facilitate a well-ordered application of a functional material and/or to guarantee the same to a certain degree, there is as yet no method of applying a functional material to a substrate in an orderly fashion. However, the well-ordered application of an organic functional material is a decisive factor influencing the charge carrier mobility thereof. Thus there is a constant need to provide methods by means of which layers of functional material can be produced that are better ordered.

It is thus an object of the present invention to provide a substrate or an undersurface, which has a well-ordered surface allowing the application/deposition of an oriented and well-ordered organic functional material.

The present invention relates to a substrate and/or underlayer of an electronic component, which substrate or underlayer is to be coated with an organic functional layer, wherein said substrate or underlayer comprises an oriented, stretched (well-ordered) plastics film such that the orderliness of the plastics film enables the application of the functional material in the form of a well-ordered layer.

By substrate, undersurface or underlayer is meant in this case any layer that can serve as a carrier for a layer containing organic functional material. It can, of course, be a film used for encapsulation, such as when an OFET is fabricated in bottom-up layout.

The term "organic material" or "functional material" or "(functional) polymer" includes in this case all types of organic, organometallic, and/or organic-inorganic man-made materials (hybrids), particularly those referred to in the English language as, e.g., "plastics". All types of materials are suitable with the exception of the semiconductors forming classical diodes (germanium, silicon) and the typical metallic conductors. It is thus not intended to dogmatically confine organic material to that consisting of purely carbonaceous material, but rather the term also covers the wide use of, say, silicones. Furthermore, the term should not, with respect to molecular size, be particularly confined to polymeric and/or oligomeric materials but can also refer to the use of "small molecules". The word component "polymer" in the term "functional polymer" is of historical origin and contains no inference to the presence of an actual polymeric compound.

Preference is given to the use of an axially stretched oriented and/or at least partially crystalline plastics film, particularly a monoaxially and preferably a biaxially stretched plastics film. For example, a suitable film is one of isotactic polypropylene, polyamide, polyethylene, polyethylene terephthalate, polyphthalamide, polyether ketone ketone (PEKK), polyether ether ketone (PEEK), syndiotactic polystyrene, polyvinylidene difluoride, polytetrafluoroethylene.

Due to the fact that the polymer films are stretched during manufacture and subsequent processing thereof, some of the crystallites formed in the substrate and thus also on its surface are highly ordered and assume the form of parallel molecular chains or chain portions which make it possible to deposit, as well-ordered layers, conjugated polymers and also organic materials of lower molecular weight (monomers, oligomers and/or "small molecules") in conducting and non-conducting forms as well as in semiconducting and nonsemiconducting forms. Application of the said organic functional layer can be carried out from solution (spin-coating, printing, immersion, knife coating etc.) or alternatively from the vapor phase (vapor deposition, sputtering etc.). The orientation of the substrate allows it to serve as a so-called "alignment template" and leads to the formation of highly ordered areas in the precipitated functional material, which leads to higher conductivity and/or higher charge carrier mobility.

The invention is explained below with reference to a FIGURE.

This shows a substrate 1, preferably a biaxially stretched plastics film, for example a film of polyethylene terephthalate (PET), which supports the source and drain electrodes 2 (of, for example, conductive polyaniline (PANI)). The semiconducting layer 3 is applied to the substrate such that it is deposited in direct contact with the biaxially stretched plastics film 1. Thus a well-ordered state is produced within the semiconducting layer, by means of which better mobility of the charge carrier is attained. For this purpose a solution of poly(3-hexylthiophene) in chloroform, for example, is applied by spin-coating to substrate 1 so as to form a homogeneous polymeric layer having a thickness of 100 nm. Following a drying step, an electrically insulating polystyrene layer 4 is applied by spin-coating to form the gate dielectric.

Production of the gate electrode 5 is effected in a manner well known to the person skilled in the art (sputtering etc.).

An organic field effect transistor (OFET) applied in this manner to a substrate which has 5 been pre-oriented by stretching shows a charge carrier mobility of $\mu > 10^{-3}$ cm$^2$/Vs. This value is several orders of magnitude higher than the mobility possible in OFETs of identical structure but having a non-oriented substrate, e.g., one of silicon or silicon dioxide. In addition, the biaxially stretching can be shown to improve the ON/OFF ratio of the transistor.

The invention makes it possible, for the first time, to increase the charge carrier mobility in organic semi-conductors by several orders of magnitude due to the selection of a suitable substrate.

The invention claimed is:

1. In an electronic organic component, the combination comprising:
   a substrate of the electronic organic component; and
   an organic functional layer coated on the substrate;
   wherein said substrate comprises a biaxially stretched (well-ordered) plastic film such that the orderliness of the plastic film forms the applied functional layer into a well-ordered layer to thereby improve electrical properties of the component.

2. In the electronic organic component as defined in claim 1, wherein the plastic film is at least partially crystalline.

3. In the electronic organic component as defined in any one of claims 1 or 2, wherein the plastic film is selected from any one of the group consisting of isotactic polypropylene, polyamide, polyethylene, or polyethylene terephthalate.

4. In the electronic organic component of any one of claims 1 or 2 wherein the component further comprises an organic field effect transistor (OFET) comprising the substrate and the functional layer forming a semiconductor layer coated on the substrate.

5. In an organic field effect transistor (OFET) the combination comprising the substrate and a semiconducting layer formed from the functional layer on and contiguous with the substrate according to claim 3.

6. The transistor of claim 4 wherein the electrical properties comprises an improved ON/OFF ratio of the transistor.

7. A method of improving electrical properties of a functional layer of organic material, wherein the functional layer is formed on and contiguous with an underlayer comprising an oriented, biaxially stretched (well-ordered) plastic film, the electrical properties of the functional layer being improved by the contiguous well ordered biaxially stretched underlayer.

8. The structure of one of claims 1 or 7 wherein the structures form a transistor whose electrical properties comprises an improved transistor ON/OFF ratio.

9. In an organic field effect transistor (OFET) the combination comprising:
   a substrate which comprises a biaxially stretched (well-ordered) plastic film; and
   a semiconducting layer above and on that substrate contiguous therewith, the semiconductor layer exhibiting improved electrical properties.

10. An organic transistor comprising:
    a substrate which comprises a biaxially stretched (well-ordered plastic film);
    a semiconducting layer above and on that substrate contiguous therewith, the semiconductor layer exhibiting improved electrical properties;
    source and drain electrodes on the substrate contiguous with the semiconductor layer;
    an insulating layer on the semiconductor layer; and
    a gate electrode on the insulating layer.

11. The transistor of claim 10 wherein the electrical properties comprise an improved ON/OFF ratio of the transistor.

* * * * *